(12) United States Patent
Cao et al.

(10) Patent No.: US 7,692,316 B2
(45) Date of Patent: Apr. 6, 2010

(54) AUDIO AMPLIFIER ASSEMBLY

(75) Inventors: Jianjun Cao, Torrance, CA (US); Jorge Cerezo, Palos Verdes, CA (US); Ajit Dubhashi, Redondo Beach, CA (US); Qun Zhao, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 283 days.

(21) Appl. No.: 11/239,967

(22) Filed: Sep. 30, 2005

(65) Prior Publication Data

US 2006/0087026 A1        Apr. 27, 2006

Related U.S. Application Data

(60) Provisional application No. 60/615,370, filed on Oct. 1, 2004.

(51) Int. Cl.
| H01L 23/48 | (2006.01) |
| H01L 23/52 | (2006.01) |
| H01L 29/40 | (2006.01) |

(52) U.S. Cl. .................. 257/784; 257/706; 257/676; 257/778; 257/666

(58) Field of Classification Search .............. 257/676, 257/678, 692, 706, 784
See application file for complete search history.

(56) References Cited

U.S. PATENT DOCUMENTS

| 6,545,533 | B2* | 4/2003 | Karki et al. ............... 330/10 |
| 6,624,522 | B2* | 9/2003 | Standing et al. ............. 257/782 |
| 7,119,447 | B2* | 10/2006 | Larking ..................... 257/784 |
| 2001/0048116 | A1* | 12/2001 | Standing et al. ............. 257/177 |
| 2004/0104489 | A1* | 6/2004 | Larking ..................... 257/787 |
| 2005/0151236 | A1* | 7/2005 | Oliver et al. ................ 257/685 |

FOREIGN PATENT DOCUMENTS

| JP | 08-124685 | 5/1996 |
| JP | 2002-076254 | 3/2002 |
| JP | 2002-534933 | 10/2002 |
| JP | 2004-095759 | 3/2004 |
| WO | WO 2004/049435 | 6/2004 |

OTHER PUBLICATIONS

Internation Rectifier, Honda et al. "Class D Audio Amplifier Design", Oct. 8, 2003, www.irf.com.*
Reinig et al., "Class-D Audio Amplifier", Apr. 29, 2004, Worcestor Polytechnic Institute, pp. 1-193.*
Office Action issued on Jul. 29, 2008 in corresponding Japanese Application No. P2005-290364.

* cited by examiner

*Primary Examiner*—Zandra Smith
*Assistant Examiner*—Telly D Green
(74) *Attorney, Agent, or Firm*—Farjami & Farjami LLP

(57) ABSTRACT

An audio amplifier assembly that includes a semiconductor package having a semiconductor power die tuned for class D amplifier applications and a conductive clip used for low inductance integration into the amplifier circuit.

13 Claims, 7 Drawing Sheets

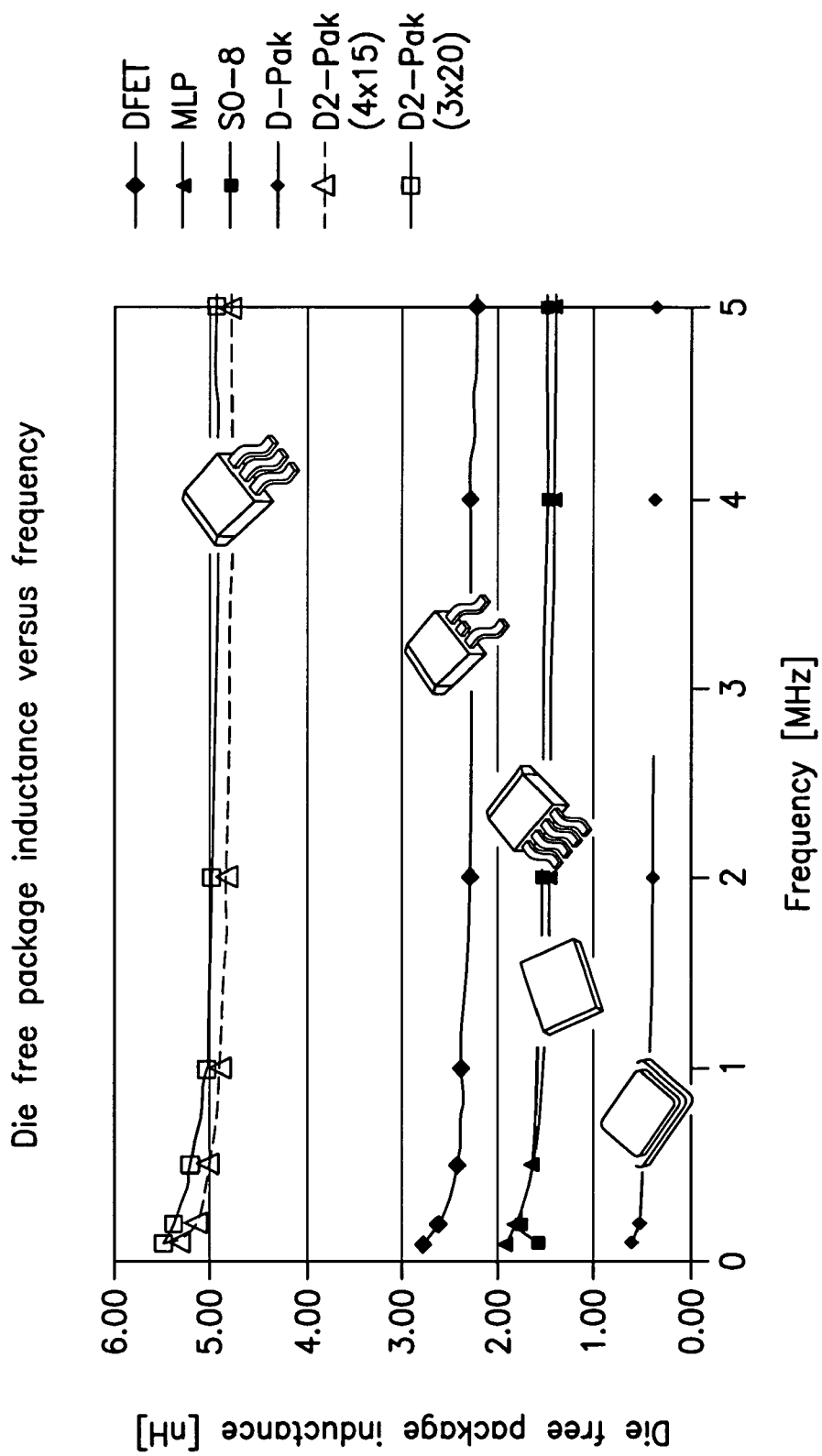

1

AUDIO AMPLIFIER ASSEMBLY

RELATED APPLICATION

This application is based on and claims the benefit of U.S. Provisional Application No. 60/615,370, filed Oct. 1, 2004, entitled 100VN DIGITAL AUDIO MOSFET IRF6665, to which a claim of priority is hereby made and the disclosure of which is incorporated by reference.

BACKGROUND AND SUMMARY OF THE INVENTION

The present invention relates to audio amplifiers and more particularly to class D audio amplifiers.

It is known to use power semiconductor devices in audio amplifier circuits. It is also well known that the characteristics of the power semiconductor device used in the amplifier circuit affects the performance of the circuit. Yet, in many amplifier applications, the negative effects due to the performance of the power semiconductor devices are alleviated by extraneous circuit elements. Such measures lead to the increase in the cost of the amplifier circuit as well as its physical size.

Furthermore, the power semiconductor devices used in prior art circuits as conventionally packaged introduce parasitic parameters such as package related parasitic inductance, resistance, and thermal characteristics.

According to the present invention a power semiconductor device such as a power MOSFET is tuned to be used in a class D amplifier assembly. That is, the characteristics of the power semiconductor device have been optimized for a class D audio amplifier.

In addition, the power semiconductor device, which has been tuned for a class D audio amplifier application, is disposed in a conductive clip and integrated within the amplifier circuit without the use of wirebonds. It has been found that the conductive clip can make a package according to the present invention particularly suitable for class D amplifiers. Specifically, the use of the conductive clip enhances performance in class D audio amplifier circuits by reducing inductance, improving switching characteristics and electromagnetic interference (EMI) rejection. Furthermore, thermal efficiency resulting from the use of the conductive clip enables 100 W operation into 8 ohms without a heatsink. Advantageously, eliminating the heatsink shrinks circuit size and bulk, giving designers more layout flexibility. Such a package is most suitable for use in medium power class D audio amplifier where the electrical characteristics, small size and improved thermal conduction offered by the device result in improved audio performance factors such as efficiency, EMI, and power density.

Such a package preferably has an Rg maximum guarantee for better dead time control, which is an important factor related to THD performance in class-D amplifiers.

Other features and advantages of the present invention will become apparent from the following description of the invention which refers to the accompanying drawings.

BRIEF DESCRIPTION OF THE FIGURES

FIG. 6 graphically compares the inductance of a package according to the present invention to the inductance of prior art packages.

DETAILED DESCRIPTION OF THE INVENTION

A power assembly according to the present invention includes a power semiconductor package having a power semiconductor die that is tuned (i.e. optimized) for class D audio amplifier applications, and is capable of wire-free integration within a class D audio amplifier circuit.

Figure 1A:
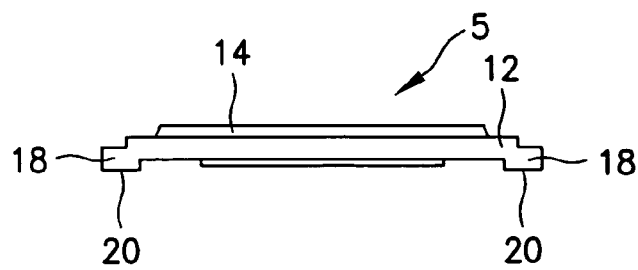
FIG. 1A shows a side plan view of a package according to the present invention.
Figure 1B:
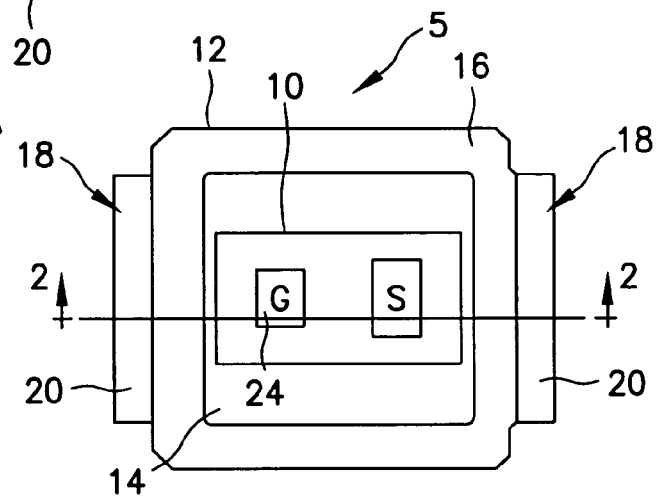
FIG. 1B shows a bottom plan view of a package according to the present invention.
Figure 2:
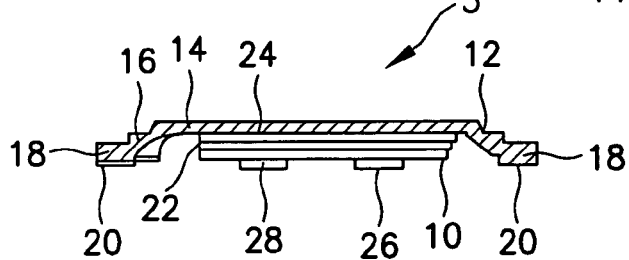
FIG. 2 shows a cross-sectional view of a package according to the present invention along line 2-2, viewed in the direction of the arrows.
Figure 3:
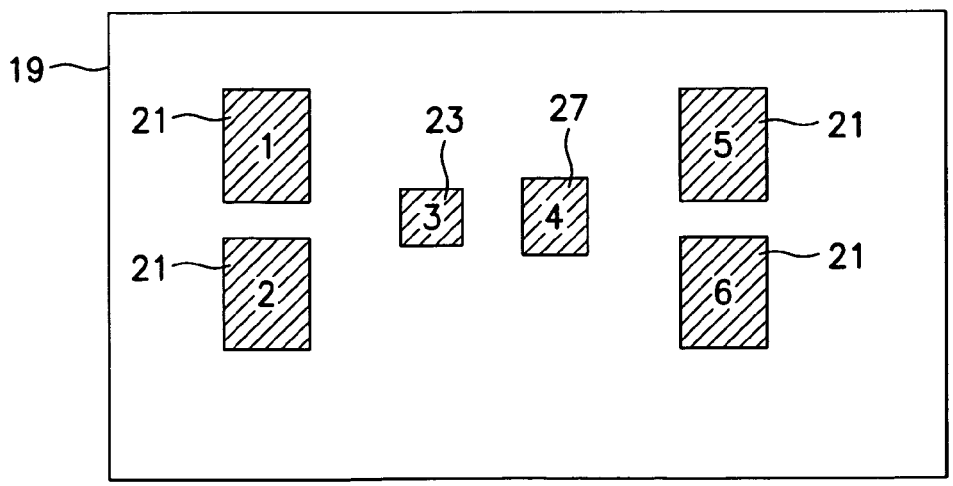
FIG. 3 shows a top plan view of a circuit board configured for receiving the package illustrated by FIGS. 1A, 1B, and 2.

Referring to FIGS. 1A, 1B and 2, a power semiconductor package 5 suitable for an assembly according to the present invention includes power semiconductor die 10 that is tuned for class D audio amplification, and electrically conductive clip 12. Preferably, clip 12 is a cup-shaped can, which includes web portion 14, a surrounding rim portion 16, which is spaced from die 10, and at least one projection 18 (and preferably two oppositely disposed projections 18). Projection 18 includes a connection surface 20, which is readied for direct electrical and mechanical connection (by a conductive adhesive such as solder or a conductive epoxy) to a corresponding conductive pad 21 (FIG. 3) of a substrate, such as a circuit board 19.

Power semiconductor die 10 includes first power electrode 22, which is electrically and mechanically connected by a conductive adhesive 24 (such as solder or a conductive polymer, such as silver loaded epoxy) to the interior surface of web portion 14 of clip 12. Furthermore, power semiconductor die 10 includes second power electrode 26 and control electrode 28 each disposed opposite first power electrode 22 and readied for direct electrical and mechanical connection (for example, by a conductive adhesive such as solder or a conductive polymer such as silver loaded epoxy) to a respective conductive pad 27, 23 (FIG. 3) on a substrate such as circuit board 19. For example, first power electrode 26 and control electrode 24 are rendered solderable if solder is used as a conductive adhesive.

In the preferred embodiment of the present invention, power semiconductor die 10 may be a power MOSFET in which first power electrode 22 is the drain electrode, second power electrode 26 is the source electrode and control electrode 28 is the gate.

Furthermore, in the preferred embodiment only lead-free solder is used wherever solder is used as a conductive adhesive.

In addition, in the preferred embodiment clip 12 is formed from copper or a copper alloy, and may be plated with silver or gold.

Package 5 is shown in U.S. Pat. No. 6,890,845, and is available from the assignee of the present application under the trademark DirectFET.

According to an aspect of the present invention package 5 is integrated with a class D audio amplifier circuit. Specifically, components of a class D audio amplifier are electrically connected to clip 12 through connection surface 20 (or connection surfaces 20), and electrically connected to second power electrode 26 whereby power semiconductor die 10 is electrically integrated with the class D audio amplifier circuit without the need for wire bonds. As a result, the inductance resulting from the wire bonds associated with conventional packages is eliminated thereby improving the performance of the class D audio amplifier.

A power MOSFET used in the preferred embodiment is tuned for class D amplifier applications, which means its key parameters such as $R_{DSON}$, $Q_g$, $Q_{sw}$, and $Q_{rr}$ have been optimized for (preferably mid-power) class D audio amplifier applications.

Table 1 shows values for key parameters of an example of a power MOSFET that is tuned for class D audio amplifier applications.

TABLE 1

| $BV_{DSS}$ (V) | $R_{DS(on)}$ typ @ 10 V (mΩ) | $V_{GS}$ (V) | $I_D$ @ $T_c$ = 25° C. (A) | $Q_G$ typ (nC) | $Q_{SW}$ typ (nC) |
|---|---|---|---|---|---|
| 100 | 53 | 20 | 19 | 8.4 | 3.4 |

Figure 4:
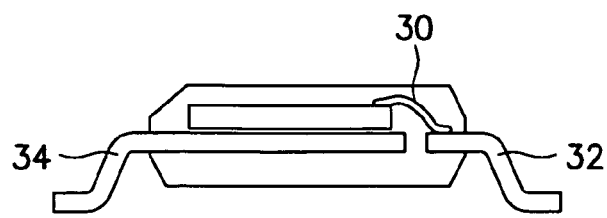
FIG. 4 illustrates a package configuration according to the prior art.

Referring to FIG. 4, a typical conventional semiconductor package, such as an SO-8 type package, includes wirebonds 30 to electrically connect at least one power electrode of the power semiconductor die contained therein to an external lead 32. In addition, a lead 34 may be used to feed electrical connection to the other power electrode of the semiconductor device. Leads 32, 34 and wirebonds 30 contribute to the overall resistance and inductance of the package. Furthermore, the majority of the heat generated by the semiconductor device can only escape through the leads.

The use of package 5 as set forth herein is advantageous in that: a) it does not include wirebonds which results in reduced inductance and resistance; b) clip 12 allows for cooling from both sides, i.e. dual sided cooling.

Figure 5A:
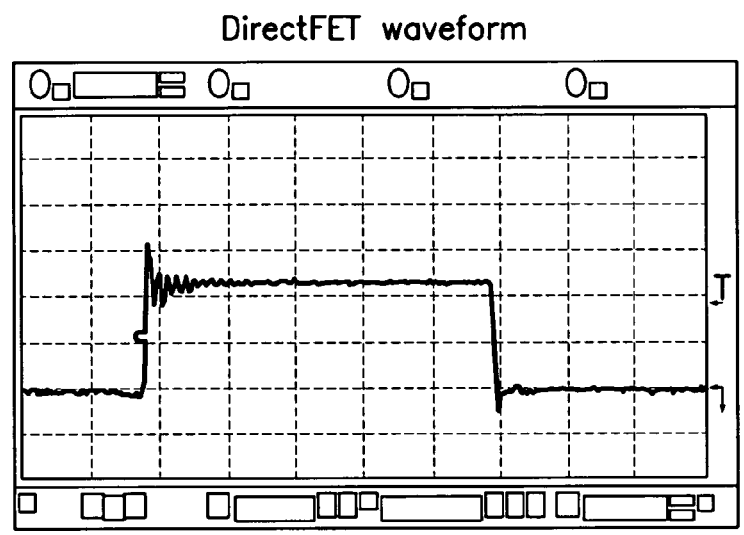
FIG. 5A shows a waveform for a package according to the present invention.
Figure 5B:
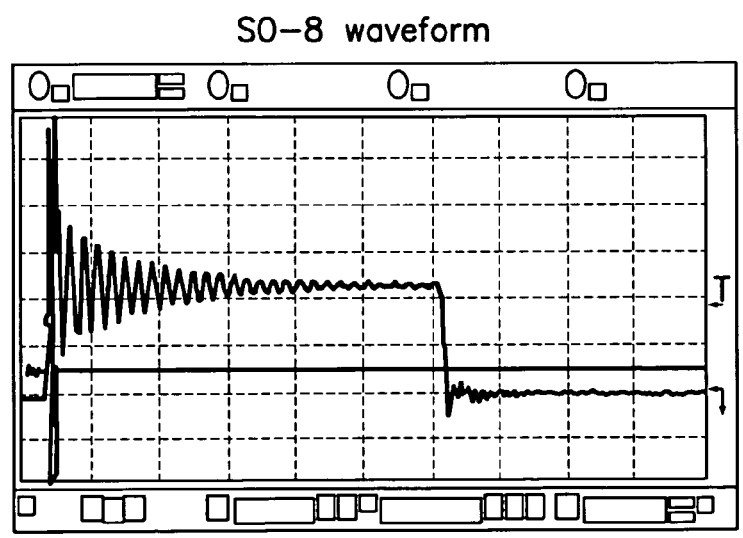
FIG. 5B shows a waveform for a package according to the prior art.

Referring to FIGS. 5A-5B, it can be seen that the inductance related ringing in a package 5 is less than a conventional SO-8 package under the same test conditions (e.g. 30 A, 500 KHz) and using nearly identical die (i.e. nearly identical active area, voltage and generation). FIG. 6 shows that package 5 can exhibit lower than 1 nH inductance, which is far superior to other known conventional packages. The reduced ringing results in the reduction of EMI which is advantageous in audio amplifier applications, and particularly class D audio amplifier applications.

Figure 7:
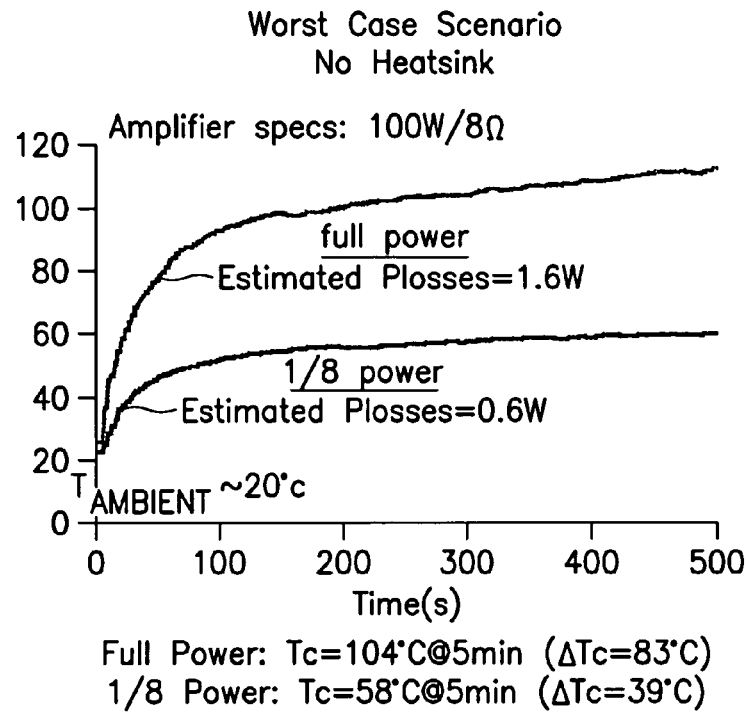
FIG. 7 graphically illustrates the case temperature vs. estimated power loss in a package according to the present invention.

Advantageously, due to dual sided cooling, package 5 is capable of delivering power up to 100 W per channel into an 8Ω load with no heatsink. FIG. 7 graphically illustrates package 5 under such conditions. The elimination of a heatsink reduces cost, and allows for a more compact assembly.

Figure 8:
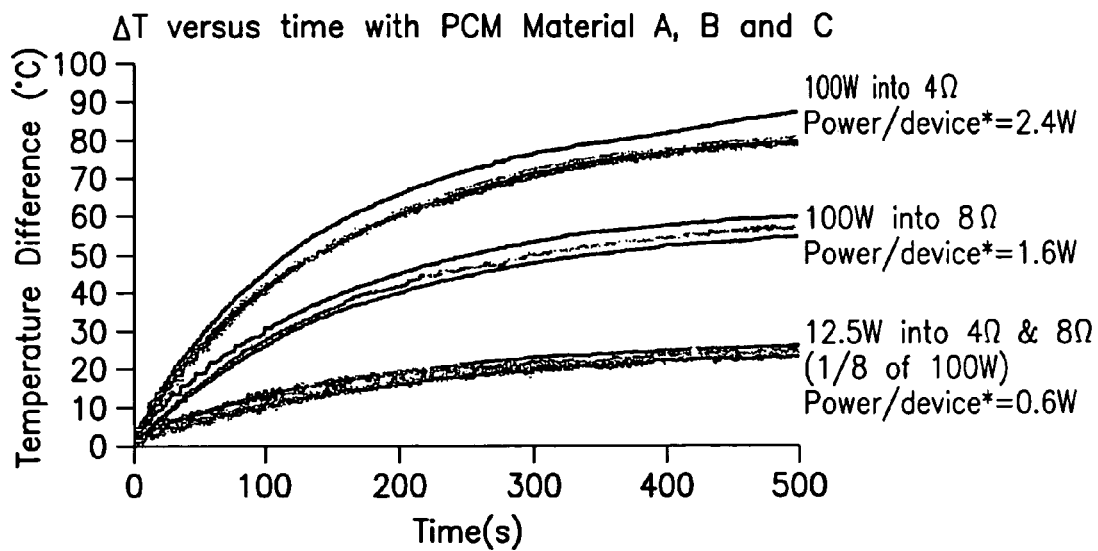
FIG. 8 graphically illustrates the temperature change in a package according to the present invention at different power levels.

It should be noted that although it is preferred to omit the heatsink, a heatsink may be used to improve heat dissipation. To evaluate the thermal performance of a package 5 with a heatsink, package 5 was thermally coupled to a heatsink using three different phase change materials (A, B, C), and constant power was applied to package 5 to determine the effect of the heatsink on the temperature of the package. Table 2 sets forth the data obtained and FIG. 8 graphically illustrates the rising of the temperature over time.

TABLE 2

| | | Temperature rise (° C.) after 5 min | | |
|---|---|---|---|---|
| Amplifier Conditions | Plosses* per device | Material A | Material B | Material C |
| 12.5 W (⅛ P into 4 & 8Ω) | 0.6 | 22.1 | 24.8 | 23.4 |
| 100 W into 8Ω | 1.6 | 52.7 | 58.2 | 55.1 |
| 100 W into 4Ω | 2.4 | 77.1 | 82.8 | 76.4 |

*Estimated Plosses @ worst case scenario

The case temperature (the outer temperature of package 5) was monitored before and during the application of power using a thermocouple applied between clip 12 and the heatsink.

To assess the performance characteristics of package 5 within a class D audio amplifier, the total harmonic distortion (THD) performance of a package 5 in a half bridge configuration was evaluated under the following conditions:

$V_{bus}$=+/−35V
$f_{switching}$=395 KHz
$f_{input}$=1 KHz
$R_{load}$=4Ω and 8Ω

Figure 9:
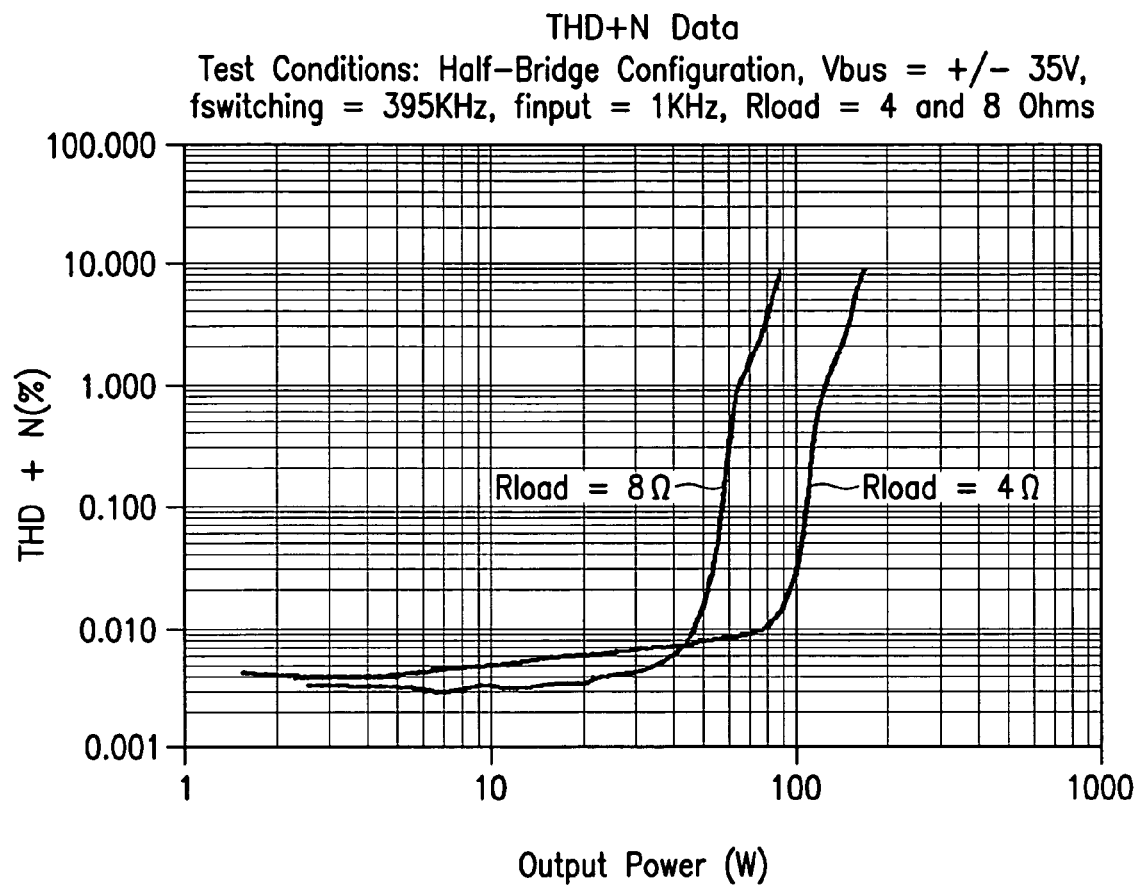
FIG. 9 graphically illustrates the THD values for a package according to the present invention in a half bridge configuration for two different load values.

The results are graphically illustrated by FIG. 9.

Figure 10:
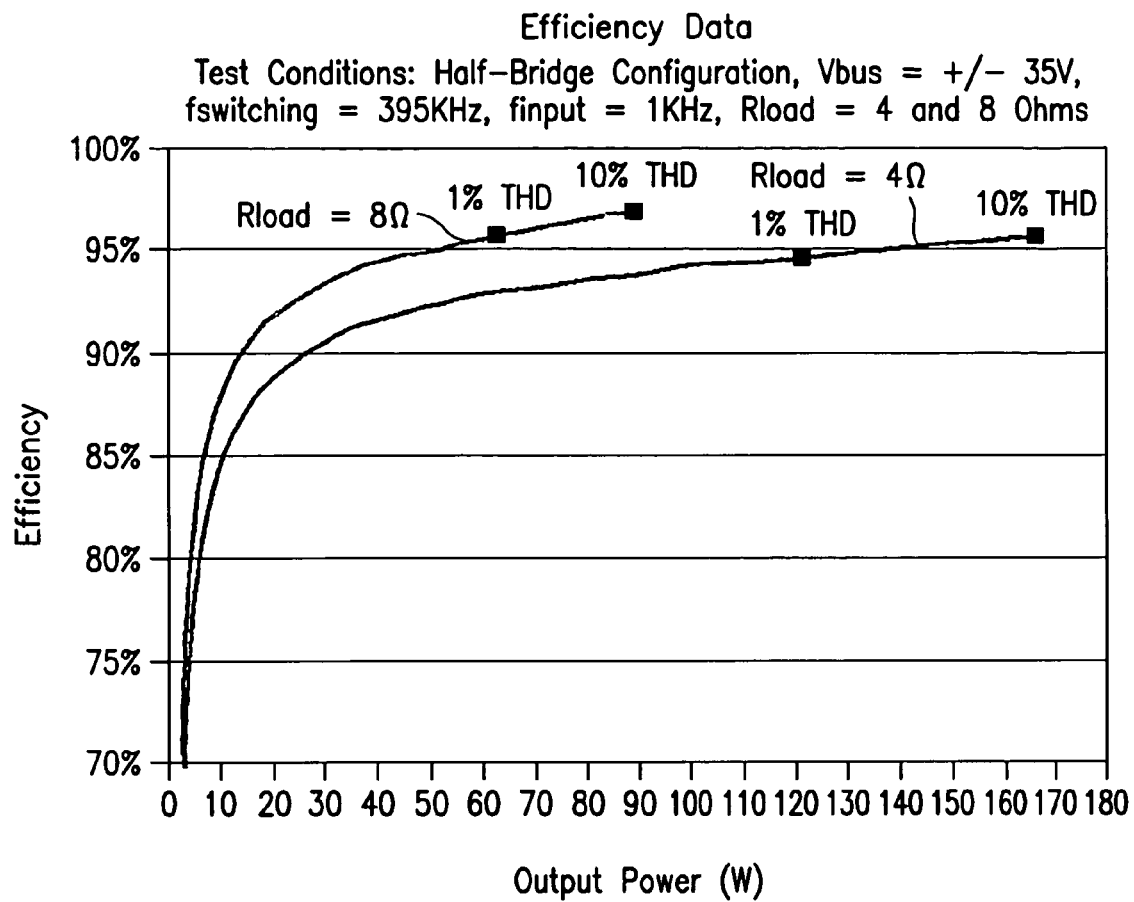
FIG. 10 graphically illustrates the efficiency of a package according to the present invention in a half bridge configuration for two different load values.

Also, the efficiency of packages 5 was evaluated under the same conditions. The results are shown by FIG. 10. FIGS. 9 and 10 further illustrate that the THD and the efficiency of package 5 in half-bridge configuration make the package ideal for class D audio amplification.

Figure 11A:
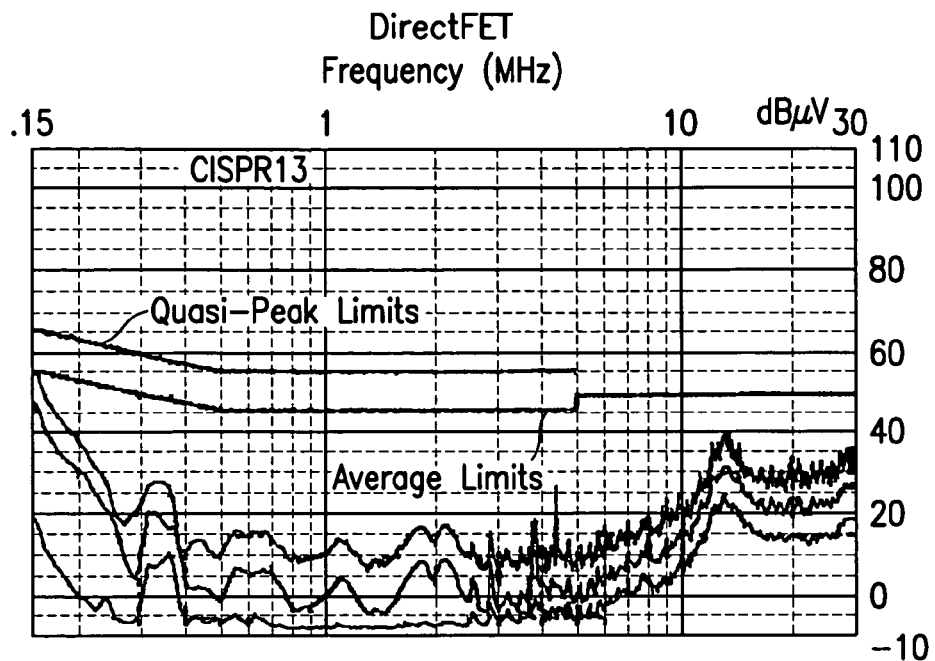
FIG. 11A graphically illustrates the EMI performance of a package according to the present invention.
Figure 11B:
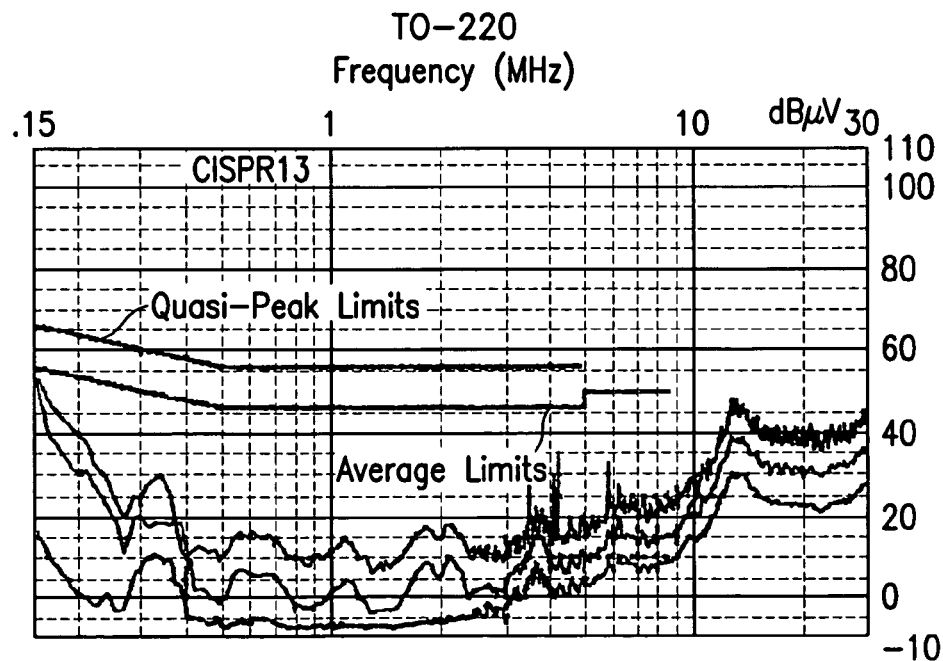
FIG. 11B graphically illustrates the EMI performance of a package according to the prior art.

The EMI performance of package 5 in a half bridge configuration was also compared to a TO-220 package, which is another well known conventional package, using identical semiconductor die and test conditions. FIGS. 11A, 11B illustrate the results obtained. To summarize, package 5 in an amplifier exhibited approximately 9 dB lower peak, quasi-peak, and average noise beyond 2 MHz. Under 2 MHz the background noise was dominant. It should be noted that, although no shielding was used, the two devices were tested under the same background conditions. Furthermore, tests have shown that package 5 in an amplifier shows a cleaner and faster (approximately three times faster) switching waveform compared to a TO-220 in an amplifier.

A package 5 is also advantageous as it may be assembled within a circuit using conventional techniques. The following is an example of a method for assembling package 5 onto a circuit board that supports a class D audio amplifier circuit:

Stencil on solder paste on the conductive pads
Pick package 5 and place on solder paste on corresponding pads
Re-flow
Place thermal interface material over packages 5
Place heatsink over thermal interface stack (optional)
Secure heatsink in place with screws
Wet out interface between clip 12 and heatsink Screw torques reset when assembly has cooled.

Based on the data, it is clear that using a wire-free package such as package 5 leads to significant performance improvements in a class D audio amplifier.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power assembly comprising:
   a package that includes:
   a power semiconductor die having $R_{DSON}$, $Q_g$, $Q_{sw}$, and $Q_{rr}$ tuned for class D audio amplification, said power semiconductor device including a first power electrode on one surface thereof, a second power electrode and a control electrode on another opposing surface thereof each readied for direct electrical and mechanical connection to a respective conductive pad; and
   an electrically conductive clip having an interior surface electrically and mechanically attached to said first power electrode by a conductive adhesive and a connection surface readied for direct electrical and mechanical connection to a conductive pad, wherein said package is integrated with a class D audio amplifier circuit, whereby components for said class D audio amplifier circuit are operatively connected to said clip and said second power electrode of said die without wirebonds.

2. The power assembly of claim 1, wherein said power semiconductor die a power MOSFET.

3. The power assembly of claim 1, wherein said conductive adhesive is solder.

4. The power assembly of claim 3, wherein said solder is lead free.

5. The power assembly of claim 1, wherein said conductive adhesive is a conductive polymer.

6. The power assembly of claim 5, wherein said conductive polymer is a conductive epoxy.

7. The power assembly of claim 1, wherein said clip is a cup-shaped can.

8. The power assembly of claim 1, wherein said clip includes a web portion, a surrounding rim portion spaced from said die, and at least one projection extending from said rim portion, wherein said projection includes said connection surface.

9. The power assembly of claim 1, wherein said clip is comprised of copper.

10. The power assembly of claim 1, wherein said clip is silver-plated.

11. The power assembly of claim 1, wherein said clip is gold-plated.

12. The power assembly of claim 1, further comprising a heat sink thermally coupled to said clip.

13. The power assembly of claim 1, wherein said assembly does not include a heatsink.

* * * * *